United States Patent
Yoshimi et al.

(10) Patent No.: US 6,617,010 B2
(45) Date of Patent: Sep. 9, 2003

(54) SEMICONDUCTOR THIN FILM AND THIN FILM DEVICE

(75) Inventors: Masashi Yoshimi, Kobe (JP); Takafumi Fujihara, Kobe (JP)

(73) Assignee: Kaneka Corporation, Osaka (JP)

(*) Notice: Subject to any disclaimer, the term of this patent is extended or adjusted under 35 U.S.C. 154(b) by 0 days.

(21) Appl. No.: 09/766,871

(22) Filed: Jan. 18, 2001

(65) Prior Publication Data

US 2001/0011748 A1 Aug. 9, 2001

Related U.S. Application Data

(63) Continuation of application No. PCT/JP99/03941, filed on Jul. 22, 1999.

(30) Foreign Application Priority Data

Jul. 22, 1998 (JP) ............................................. 10-206605

(51) Int. Cl.$^7$ ............................................. H01L 21/205
(52) U.S. Cl. ...................... 428/209; 428/620; 428/641; 428/336; 428/446; 428/450
(58) Field of Search .................... 428/446, 209, 428/641, 620, 336, 450

(56) References Cited

U.S. PATENT DOCUMENTS

| | | | | |
|---|---|---|---|---|
| 5,114,498 A | * | 5/1992 | Okamoto et al. | 136/258 |
| 5,456,762 A | * | 10/1995 | Kariya et al. | 136/258 |
| 5,719,076 A | * | 2/1998 | Guha | 438/96 |
| 6,335,266 B1 | * | 1/2002 | Kitahara et al. | 438/475 |

FOREIGN PATENT DOCUMENTS

| | | |
|---|---|---|
| JP | 62-237767 | 10/1987 |
| JP | 2-140925 | 5/1990 |
| JP | 6-283589 | 10/1994 |
| JP | 8-227167 | 9/1996 |

OTHER PUBLICATIONS

International Preliminary Examination Report/ Sep. 26, 2000—International Application No. PCT/JP99/03941.

* cited by examiner

Primary Examiner—Deborah Jones
Assistant Examiner—Stephen Stein
(74) Attorney, Agent, or Firm—Hogan & Hartson LLP

(57) ABSTRACT

A semiconductor thin film which is deposited by using a chemical vapor deposition method at an underlying layer temperature of 400° C. or less, and contains, as main component elements, a Group IV atom and hydrogen atom. A temperature dependency of an amount of release of hydrogen atoms within the film when the film is heated from room temperature exhibits a profile having a peak of the hydrogen releasing amount at 370° C. or higher and 410° C. or less, and a half-value width of the peak is 30° C. or less.

3 Claims, 1 Drawing Sheet

SEMICONDUCTOR THIN FILM AND THIN FILM DEVICE

CROSS-REFERENCE TO RELATED APPLICATIONS

This is a continuation of international application No. PCT/JP99/03941 filed Jul. 22, 1999, which application is hereby incorporated by reference in its entirety.

This application is based upon and claims the benefit of priority from the prior Japanese Patent Application No. 10-206605, filed Jul. 22, 1998, the entire contents of which are incorporated herein by reference.

BACKGROUND OF THE INVENTION

The present invention relates to an improvement in the quality of a semiconductor thin film and an improvement in the performance of a semiconductor thin film device, and is widely applicable to functional thin film devices such as thin film transistors and photovoltaic devices.

It is widely known that the electrical and photoelectrical properties of amorphous Group IV semiconductors are remarkably improved by terminating unjoined bonds (dangling bonds) of, for example, an amorphous semiconductor or polycrystalline semiconductor, with hydrogen atoms to inactivate them. For introducing hydrogen atoms, techniques of implanting activated hydrogen gas into a semiconductor material that does not contain hydrogen or that has insufficient termination with hydrogen are mainly used. Specific examples include an ion implanting method and a plasma hydrogen doping method. However, these methods introduce hydrogen particles of high energy and thus cause damages to the semiconductor bulk material, or require a high-temperature process at a certain temperature level or higher to incorporate hydrogen atoms efficiently. Further, they require both steps of forming a semiconductor material and of hydrogenating it, thus increasing the number of processing steps.

On the other hand, with chemical vapor deposition methods including plasma CVD, in which a semiconductor thin film is formed by decomposing a raw material gas containing hydrogen atoms, such as a silane-based gas, hydrogen atoms are incorporated within a semiconductor film already immediately after the deposition. Thus, the methods do not require a process of introducing hydrogen in a later stage, making it possible to form a hydrogenated semiconductor thin film in a simple manner. In addition, since they can form a high-quality thin film on an inexpensive substrate by the low-temperature process, it is expected that the cost for the device can be reduced, and at the same time, the performance of the device can be improved. Actually, these methods can produce amorphous silicon, for example, with a quality applicable to functional devices such as photovoltaic devices and thin film transistors.

However, when a hydrogenated semiconductor thin film is deposited by the plasma CVD method, it is not easy to control the process so as to incorporate a necessary and sufficient amount of hydrogen for terminating the dangling bonds. In practice, an excessive amount of hydrogen is present in the film, resulting in instability of the film and non-uniformity of the micro-structure of the film. Further, even if hydrogen is incorporated efficiently in terms of amount, the bonding strength, that is, the bonding energy, with a Group IV semiconductor atom, is not constant, but weak bonds and strong bonds exist dispersively, which causes a turbulence of the film structure and influences the stability, ultimately deciding the electrical properties of the semiconductor material. Indeed, in a hydrogenated amorphous semiconductor or the like, when the process of releasing hydrogen contained in the film is analyzed as the temperature is increased while heating the film, and the temperature profile of its hydrogen releasing amount is observed, a broad releasing process can be observed in a broad range from some tens of degrees (° C.) or even 100 degrees or higher. The correlation between released hydrogen and temperature corresponds to the bonding energy between the Group IV semiconductor and hydrogen atom within the film, and it implies that the dispersion is large. This is also the case for hydrogenated semiconductor films which contain crystalline materials.

In view of the above-described problems of the conventional techniques, an object of the present invention is to improve the quality of a hydrogenated semiconductor thin film formed by a low-temperature plasma CVD method by controlling the state of hydrogen atoms in the thin film, as well as to enhance the performance of the semiconductor thin film device.

BRIEF SUMMARY OF THE INVENTION

The present invention provides a semiconductor thin film which is deposited by using a chemical vapor deposition method at an underlying layer temperature of 400° C. or less, and contains, as main component elements, a Group IV atom and hydrogen atom, wherein a temperature dependency of an amount of release of hydrogen atoms within the film when the film is heated from room temperature exhibits a profile having a peak of the hydrogen releasing amount at 370° C. or higher and 410° C. or less, and a half-value width of the peak is 30° C. or less, more preferably 20° C. or less.

Further, the present invention provides a thin film device comprising a semiconductor unit portion including a semiconductor thin film of the present invention and an electrode portion including a electrically conductive thin film, wherein these portions are formed on the same substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
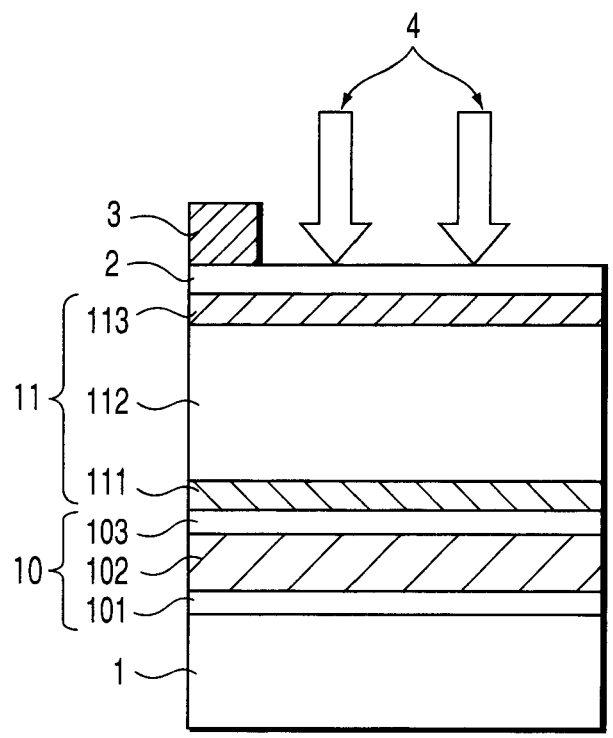
FIG. 1 is a cross sectional view of a structure of a hydrogenated silicon-based thin film photovoltaic device to which the present invention is applied as one example.

Semiconductor thin films, to which an embodiment of the present invention is applied, can be formed by a method described below.

As the chemical vapor deposition, which is a method of forming a semiconductor thin film, a generally and widely used parallel plate-type RF plasma CVD method can be employed. It may be of a type in which a high frequency power of an RF to VHF band at the frequency of 150 MHz or less can also be used. The film forming temperature is set at 400° C. or less for a reason that hydrogen atoms contained in the film will not be released while forming the film but remain in sufficient amount, and for another reason that an inexpensive substrate can be used. As the main component of the raw material gas introduced into a reaction chamber, a gas of a hydrogenated Group IV element is used. In the case of silicon, for example, monosilane, disilane or dichlorsilane can be used. As a raw material for carbon, methane can be used, and as a raw material for germanium, germane or the like is used. In addition to these material gases, a dilution gas is introduced into the reaction chamber. As the dilution gas, hydrogen gas is mainly used, and further an inert gas such as noble gas, preferably helium, neon, argon or the like may be used. It is preferable that the flow rate of the dilution gas with respect to that of the raw material gas should be 20 times or more, and an optimal dilution amount is determined based on the combination with other film forming conditions such as the temperature of the underlying substrate, discharge power and the pressure within the reaction chamber.

The semiconductor thin film having the Group IV element as a main component contains a relatively large amount of hydrogen atoms which serves to terminate and inactivate defects at crystal grain boundaries or within a grain, since it is formed at a low temperature. In the film in which the hydrogen content is 1 atomic % or more and 20 atomic % or less, the distribution of the bonding state between the Group IV atoms and hydrogen atoms can be estimated from the dependency of the hydrogen atom releasing amount on the increase in the temperature while the formed film is being gradually heated from room temperature. The relationship between the released hydrogen amount and temperature corresponds to the bonding energy between the Group IV atom and hydrogen atom within the film. When a measurement result is illustrated in a profile diagram where the temperature is taken in the abscissa axis and the amount of hydrogen released is taken in the ordinate axis, the semiconductor thin film of the present invention is characterized by its profile having one peak within a range of 370° C. or more and 410° C. or less, with a half-value width of the peak of 30° C. or less, more preferably, 20° C. or less, in that diagram.

The thin film device, to which an embodiment of the present invention is applied, has a semiconductor unit portion including a semiconductor thin film, as described above, containing Group IV atom and hydrogen atom as its main components. The thickness of the semiconductor thin film should preferably be in a range of 0.1 $\mu$m or more and 20 $\mu$m or less. If the thickness of the film is less than this range, the film is insufficient in terms of volume to achieve the device performance, whereas if it exceeds the range, the production cost for such a semiconductor thin film becomes high, which impairs the merit of the thin film device. Further, the thin film device has an electrode portion including an electrically conductive thin film, in addition to the above-described semiconductor unit portion, which are laminated on the same substrate. As the conductive thin film, a metal thin film and a transparent conductive oxide film, having such a low resistance that can be used as an electrode, can be used. Further, the thin film device may further include an insulating thin film such as a silicon oxide film or silicon nitride film laminated on the same substrate.

Examples of the type of the thin film device include a MOS or MIS-type junction device such as a thin film transistor (TFT), and a p-n or p-i-n junction device such as a sensor, an imaging device and a photovoltaic device including a solar cell. Here, a more specific embodiment of the present invention will now be described below taking, as an example, a hydrogenated thin film for the semiconductor thin film and a hydrogenated thin film silicon-based photovoltaic device for the thin film device.

As the substrate, a metal such as stainless, an organic film or an inexpensive glass having a low melting point, or the like is used.

First, as a rear electrode portion provided on the substrate, a thin film layer formed of one or more of the item (A) and (B) below is formed by, for example, a vapor deposition method or sputtering method.

(A) A metal thin film made of at least one material selected from the group consisting of Ti, Cr, Al, Ag, Au, Cu and Pt, or an alloy thereof.

(B) A transparent conductive oxide film comprising at least one layer of material selected from the group consisting of ITO, $SnO_2$ and ZnO.

Next, a photovoltaic unit of an n-i-p or p-i-n junction is formed. Here, it should be noted that all of the layers which constitute the photovoltaic unit are deposited by the plasma CVD method under a condition that the temperature of the substrate is 400° C. or less. A generally and widely used parallel plate-type RF plasma CVD method is employed. Use may also be made of the plasma CVD method using a high frequency power of an RF to VHF band at a frequency of 150 MHz or less.

Firstly, of the photovoltaic unit, a one conductivity type layer is deposited. Here, for example, an n-type silicon-based thin film to which phosphorus atoms, which are conductivity type-determining impurity atoms, have been doped, or a p-type silicon-based thin film to which boron atoms have been doped, or the like can be used. These conditions are not restrictive, and as the impurity atom, for example, nitrogen or the like may be used in an n-type layer. Further, as specific components and forms of the one conductivity type layer, it is possible to use an alloy material such as amorphous silicon carbide or amorphous silicon germanium, in addition to amorphous silicon, or also possible to use polycrystalline silicon, microcrystalline silicon partially containing crystalline one, or an alloy metallic material thereof. In some cases, the percent crystallinity and the carrier concentration due to the conductivity-determining impurity atom are controlled by irradiating a pulse laser beam after the deposition of the one conductivity type layer Subsequently, as the photoelectric conversion layer of the bottom cell, a hydrogenated silicon-based thin film, which is the semiconductor thin film of the present invention, is deposited. Here, it is preferable that a non-doped intrinsic thin film silicon or a silicon-based thin film material of a weak p-type or weak n-type, which contains a very small amount of impurity, and has a sufficient photoelectric conversion function, should be used. The present invention is not limited to these, and alloy materials such as silicon carbide and silicon germanium may be used. The thickness of the photoelectric conversion layer is 0.1 to 20 $\mu$m which provides a necessary and sufficient thickness as the silicon-based thin film photoelectric conversion layer.

Subsequent to the deposition of the photoelectric conversion layer of the photovoltaic unit, a silicon-based thin film of a conductivity type opposite to the one conductivity type described above is deposited. As the opposite conductivity type layer, for example, a p-type silicon-based thin film to which boron atoms, which are conductivity type determining impurity atoms, have been doped, or an n-type silicon-based thin film to which phosphorous atoms have been doped, or the like is used. These conditions are not restrictive, and as the impurity atom, for example, aluminum or the like may be used in the p-type layer. Further, as specific components and forms of the conductivity type layer, it is possible to use an alloy material such as amorphous silicon carbide or amorphous silicon germanium, in addition to amorphous silicon, or also possible to use polycrystalline silicon, microcrystalline silicon containing crystalline materials partially, or an alloy metallic material.

After the deposition of the photovoltaic unit portion, a transparent conductive oxide film made of at least one layer of material selected from the group consisting of ITO, $SnO_2$ and ZnO is formed by, for example, a vapor deposition method or sputtering method. In some cases, a comb-shaped metal electrode made of at least one material selected from the group consisting of Al, Ag, Au, Cu and Pt, or an alloy layer thereof is formed on the oxide film, providing a grid electrode.

With reference to FIG. 1, thin film silicon photovoltaic devices, which serve as photovoltaic devices according to some examples of the present invention, and comparative examples, will be described below.

EXAMPLE 1

On a glass substrate 1, a Ti film 101, Ag film 102 and a ZnO film 103 were formed to thicknesses of 50 nm, 300 nm and 100 nm, respectively, by the sputtering method to provide a rear electrode 10. Next, a phosphorous-doped n-type silicon layer 111, a non-doped thin film silicon photoelectric conversion layer 112, and a p-type silicon layer 113 were formed to thicknesses of 20 nm, 2.5 micrometers and 10 nm, respectively, each by the RF plasma CVD method to provide an n-i-p junction silicon photovoltaic unit 11. Further, a transparent conductive film (ITO) 2 having a thickness of 80 nm was formed as an upper electrode and a comb-shaped Ag electrode 3 for outputting an electric current was formed.

Here, the hydrogenated silicon film, which provides the thin film silicon photoelectric conversion layer 112, was deposited by the RF plasma CVD method using a high-frequency power of 13.56 MHz. The reaction gas was obtained by mixing silane and hydrogen at a flow rate ratio of 1:90, and the pressure within the reaction chamber was set at 5.0 Torr. Further, the discharge power density was set at 100 $mW/cm^2$ and the film forming temperature was set at 30° C. The hydrogenated silicon film formed under these film forming conditions was subjected to a secondary ion mass spectrometry, and the hydrogen atom content within the film was measured to be 2.5 atomic %.

The output properties of this thin film silicon photovoltaic device when an incident light 4 having an AM of 1.5 and a light intensity of 100 $mW/cm^2$ was used were: a open circuit voltage of 0.520 volts, a short-circuit current density of 27.4 $mA/cm^2$, a fill factor of 75.1% and a photoelectric conversion efficiency of 10.7%.

COMPARATIVE EXAMPLE 1

Similarly, a thin film silicon photovoltaic device was formed on a glass substrate. The film forming conditions and the device structure were the same as in Example 1 described above, except for the film forming conditions for a photoelectric conversion layer 112.

Here, the hydrogenated silicon film, which provides the thin film silicon photoelectric conversion layer 112, was deposited by the RF plasma CVD method using a high-frequency power of 13.56 MHz. The other film forming conditions were the same as in Example 1 except that the reaction gas was obtained by mixing silane and hydrogen at a flow rate ratio of 1:150. The hydrogenated silicon film formed was subjected to a secondary ion mass spectrometry, and the hydrogen atom content within the film was measured to be 2.8 atomic %.

The output properties of this thin film silicon photovoltaic device when an incident light 4 having an AM of 1.5 and a light intensity of 100 $mW/cm^2$ was used were: a open circuit voltage of 0.402 volts, a short-circuit current density of 27.7 $mA/cm^2$, a fill factor of 73.1% and a photoelectric conversion efficiency of 8.1%.

<Comparison between Example 1 and Comparative Example 2>

The process in which hydrogen within the hydrogenated silicon film was released with an increase in the heating temperature of the film was analyzed. A sample was placed in a mass spectrometer for a gas released with an increasing temperature. The starting temperature was set at room temperature (about 20° C.), and the sample was heated to a finishing temperature of 600° C. at a rate of 10° C. per minute. Of the gas released from the film, the relative value of the amount of released $H_2$ molecule having a mass number of 2 was monitored.

Figure 2:
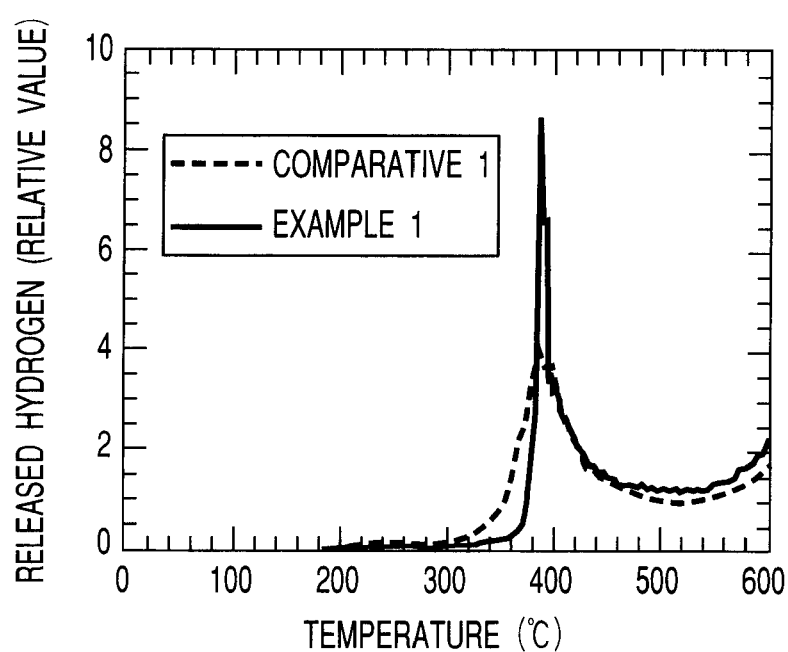
FIG. 2 is a graph illustrating the temperature dependency of the amount of release of hydrogen in a hydrogenated silicon-based thin film in Example 1 of the present invention, and that of a comparative example.

With regard to the photovoltaic devices described in Example 1 and comparative Example 1 above, the sample in each case at the point where the photovoltaic unit 11 has been formed was subjected to the analysis of the increasing temperature dependency of the released hydrogen amount, and the results were presented in FIG. 2. Of the silicon films contained in the photovoltaic unit, the thickness of each of the n- and p-type conductivity type layers was very small as compared to that of the photoelectric conversion layer, and therefore it was determined that most of the released hydrogen observed was from the non-doped hydrogenated silicon film which is the photoelectric conversion layer. Each case indicates a profile having one peak at a temperature near 388° C., and it is observed that the released hydrogen was concentrated near this temperature. However, in the sample of Example 1, stronger release of hydrogen was observed within a narrower temperature range. From the estimation of the half-width value obtained by taking an interval between the temperatures at which the hydrogen releasing amount is a half of the peak value, it was 11° C. in Example 1, whereas 70° C. in Comparative Example 1. As already mentioned above, there was no significant difference between the both cases in terms of physical properties including the absolute value of the total hydrogen amount contained in the film; however the performance as the photovoltaic device is clearly higher in Example 1. The relationship between the released hydrogen and temperature corresponds to the bonding energy between silicon and hydrogen atoms within the film (note that it is considered that most of the bonding is for the passivation of the crystal grain boundaries). In a film obtained under such conditions that a high performance can be obtained, the dispersion of the bonding energy is less and uniform. As to Comparative Example 1, in the film forming conditions for the hydrogenated silicon film, the degree of dilution of silane gas with hydrogen gas is increased. When a film is formed by the plasma CVD method under these conditions, the energy of hydrogen radicals or ions becomes high, and the damage caused to the deposited film becomes prominent. Consequently, the possibility that hydrogen atoms are implanted into the crystal grains and excessively taken into the film becomes high. As a result, a fine structural turbulence is likely to occur within the film, and it is therefore considered that the electric properties and photo-electric properties of the hydrogenated silicon film are lower than those of Example of the invention.

EXAMPLES 2–6 AND COMPARATIVE EXAMPLES 2–4

Hydrogenated silicon films were formed under the conditions presented in TABLE 1, and thin film silicon photovoltaic devices were formed on glass substrates as in Example 1 and Comparative Example 1, respectively. In each case, the hydrogen content in the film and the half-value width of a peak appearing near 390° C. in a temperature profile of the hydrogen releasing amount obtained by the analysis of release due to heating are presented as well. The film forming conditions and device structures of the other layers than those of the hydrogenated silicon film which gives rise to the thin film silicon photoelectric conversion layer 112 are the same as those of Example 1. The results of the output properties of the photovoltaic device were as presented in TABLE 2.

TABLE 1

|  | Gas Flow Rate Ratio Silane/ Hydrogen | Temp. (° C.) | Pressure (Torr) | Discharge Power (mW/ $cm^2$) | Hydrogen Amount in the Film (Atomic %) | Half-width value of Temperature Profile for Amount of Hydrogen Released (° C.) |
| --- | --- | --- | --- | --- | --- | --- |
| Example 2 | 1/100 | 300 | 5.0 | 100 | 2.5 | 20 |
| Example 3 | 1/28 | 300 | 1.0 | 18 | 2.2 | 14 |
| Example 4 | 1/190 | 300 | 10.0 | 400 | 3.0 | 13 |
| Example 5 | 1/200 | 220 | 10.0 | 400 | 4.6 | 14 |
| Example 6 | 1/210 | 180 | 10.0 | 400 | 5.7 | 12 |
| Comparative Example 2 | 1/120 | 300 | 5.0 | 100 | 2.5 | 32 |
| Comparative Example 3 | 1/80 | 300 | 5.0 | 100 | 7.7 | 54 |
| Comparative Example 4 | 1/80 | 200 | 5.0 | 100 | 10.7 | 64 |

TABLE 2

|  | Voc (volts) | Jsc (mA/$cm^2$) | F.F. (%) | Eff. (%) |
| --- | --- | --- | --- | --- |
| Example 2 | 0.471 | 27.2 | 74.9 | 9.6 |
| Example 3 | 0.488 | 27.0 | 75.9 | 10.0 |
| Example 4 | 0.529 | 27.0 | 75.2 | 10.7 |
| Example 5 | 0.534 | 26.8 | 76.2 | 10.9 |
| Example 6 | 0.540 | 26.5 | 76.1 | 10.6 |
| Comparative Example 2 | 0.455 | 27.1 | 73.9 | 9.1 |
| Comparative Example 3 | 0.624 | 19.3 | 64.4 | 7.8 |
| Comparative Example 4 | 0.712 | 16.8 | 54.8 | 6.6 |

As presented in Examples 2–6 in TABLE 1, the parameters of the film forming conditions are various, but the films with a small half-value width in the releasing hydrogen amount temperature profile were obtained by appropriately selecting a combination of these parameters. With such combination, the conversion efficiency of each of such photovoltaic devices is high. On the other hand, in Comparative Examples 2–4, the half-value width is large and therefore the conversion efficiency of the photovoltaic device in each of these cases is low. This is because, with regard to Comparative Example 2, the selected value of the gas flow rate ratio is excessively high as in the case of Comparative Example 1, and therefore the energy of the hydrogen radicals and ions is excessively applied while forming a film by the plasma CVD. Further, in Comparative Examples 3 and 4, the energy of the hydrogen radicals and ions is insufficient, and therefore the structure relaxation of the deposited film is not sufficient, but the distortion and defects are considered to be more prominent. It is further because, as compared to those of Examples of the invention, the hydrogen content within the film is relatively high, silicon-hydrogen bonds exist locally at high densities, and therefore many void-like structural portions exist. Thus, the hydrogenated silicon thin film of the present invention can be realized by setting such film forming conditions that can apply appropriate hydrogen radial and ion energy.

As described above, according to the present invention, it is possible to improve the quality of the semiconductor thin film formed at low temperature and containing, as main structural components, an Group IV element and hydrogen atoms, and therefore it becomes possible to contribute remarkably to the improvement of the performance of low-cost thin film devices including a thin film silicon-based photovoltaic device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor thin film which is deposited by using a chemical vapor deposition method at an underlying layer temperature of 400° C. or less, and contains, as main component elements, a Group IV atom and hydrogen atom, wherein a temperature dependency of an amount of release of hydrogen atoms within the film when the film is heated from room temperature exhibits a profile having a peak of the hydrogen releasing amount at 370° C. or higher and 410° C. or less, and a half-value width of said peak is 30° C. or less.

2. The semiconductor thin film according to claim 1, wherein a hydrogen content within the film at room temperature atmosphere is 1 atomic % or higher and 20 atomic % or less.

3. A thin film device comprising a semiconductor unit portion including a semiconductor thin film according to claim 1 or 2, which has a thickness in a range of 0.1 μm or more and 20 μm or less, and an electrode portion including an electrically conductive thin film, wherein said portions are formed on the same substrate.

* * * * *